United States Patent
Miyazaki et al.

(10) Patent No.: US 6,614,378 B2
(45) Date of Patent: Sep. 2, 2003

(54) SAMPLING PROCESSING DEVICE AND IMAGING APPARATUS USING IT

(75) Inventors: Harutomi Miyazaki, Tokyo (JP); Yasushi Sato, Kanagawa (JP); Toshiaki Kodake, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/920,725

(22) Filed: Aug. 3, 2001

(65) Prior Publication Data

US 2002/0030613 A1 Mar. 14, 2002

(30) Foreign Application Priority Data

Aug. 10, 2000 (JP) ..................... P2000-242113

(51) Int. Cl.[7] .............................................. H03M 1/12
(52) U.S. Cl. .................. 341/155; 341/122; 348/294
(58) Field of Search ................ 341/112, 155, 341/76; 348/294

(56) References Cited

U.S. PATENT DOCUMENTS

| | | | | |
|---|---|---|---|---|
| 4,412,249 A | * | 10/1983 | Carmen | 358/112 |
| 4,559,432 A | * | 12/1985 | Itoh | 219/69 |
| 4,651,131 A | * | 3/1987 | Pearce | 341/155 |
| 4,677,422 A | * | 6/1987 | Naito | 340/347 |
| 4,935,912 A | | 6/1990 | Hirano et al. | 369/441.11 |
| 5,166,811 A | * | 11/1992 | Nagano | 358/483 |
| 5,319,450 A | * | 6/1994 | Tamayama et al. | 348/692 |
| 5,341,218 A | * | 8/1994 | Kaneko et al. | 348/695 |
| 5,479,208 A | * | 12/1995 | Okumura | 348/301 |
| 6,111,606 A | * | 8/2000 | Ikeda | 348/241 |
| 6,154,159 A | * | 11/2000 | Law et al. | 341/122 |
| 6,262,677 B1 | * | 7/2001 | Kiriaki et al. | 341/122 |
| 6,275,259 B1 | | 8/2001 | Gowda et al. | 348/229 |
| 6,313,770 B1 | * | 11/2001 | Cave | 341/122 |

FOREIGN PATENT DOCUMENTS

| | | | |
|---|---|---|---|
| EP | 107 884 | 10/1983 | G01R/23/02 |
| EP | 729 234 | 8/1996 | H03M/1/18 |
| EP | 773 673 | 5/1997 | H04N/5/335 |
| JP | 11-266156 | 9/1999 | H03M/1/36 |
| JP | 2000-013691 | 1/2000 | H04N/5/335 |
| WO | 99/07138 | 2/1999 | H04N/5/217 |

OTHER PUBLICATIONS

"Correlated Triple Sampling: A Digital Low–Noise Read-out—Method for CCD'S", Wey, H., Wang, Z., Guggenbuhl W., Melecon 1985/vol. II: Digital Signal Processing A. Luque, A.R. Figueiras Vidal, V. Cappellini (eds.) Elsevier Science Publishers B.V. (Notth–Holland) XP–002081182.

* cited by examiner

Primary Examiner—Peguy JeanPierre
(74) Attorney, Agent, or Firm—Ronald P. Kanenen, Esq.; Rader, Fishman & Grauer PLLC

(57) ABSTRACT

A sample-and-hold circuit and an analog-to-digital conversion circuit are provided, and a latch circuit is provided downstream of the analog-to-digital conversion circuit. For example, a correlated double sampling (CDS) circuit is configured in which a first latch circuit is disposed downstream of the analog-to-digital conversion circuit and a second latch circuit is disposed downstream of the first latch circuit. Delayed output signals of the respective latch circuits are sent to a calculation section, which takes subtraction between those output signals. Resulting data is output via another latch circuit.

9 Claims, 3 Drawing Sheets

SAMPLING PROCESSING DEVICE AND IMAGING APPARATUS USING IT

BACKGROUND OF THE INVENTION

1. Field of the Invention

The present invention relates to a technique of realizing a sampling processing device suitable for digitization and IC-chip implementation.

2. Description of the Related Art

In general, digital signal processing devices perform various kinds of sampling processing. For example, a circuit shown in FIG. 1 is an analog circuit that performs correlated double sampling that is used in image processing devices (e.g., ones for signal processing for a solid-state imaging device).

In processing circuit a shown in FIG. 1, an input signal Sin is branched into two parts at point A. One of the two parts is input to a first-stage sample-and-hold circuit b via a capacitor C1 and then sent to (the positive input terminal of) an analog amplifier d via a second-stage sample-and-hold circuit c. The other part of the input signal Sin is input to a sample-and-hold circuit e via a capacitor C2 and then sent to (the negative input terminal of) the analog amplifier d.

Receiving output signals of the respective sample-and-hold circuits c and e, the analog amplifier d outputs a result of an operation of taking the difference between the two output signals.

In FIG. 1, for the sake of convenience, "sample-and-hold circuit" is abbreviated as "S/H." As for sample-and-hold pulse signals that are sent from a signal generation circuit (not shown) to the respective sample-and-hold circuits, a signal SH1 is supplied to the sample-and-hold circuit b and a signal SH2 is supplied to the sample-and-hold circuits c and e. For example, in signal processing for a solid-state imaging device, an imaging signal produced by the imaging device is supplied to this circuit as the input signal Sin. Reset voltages of the input signal Sin are sampled according to the signal SH1 (a sample-and-hold signal for pre-charging portions) and signal voltages of the input signal Sin are sampled according to the signal SH2 (a sample-and-hold signal for data portions).

An output signal of the above sampling processing circuit is subjected to quantization by an analog-to-digital conversion circuit.

However, because of the use of the analog amplifier d and the three sample-and-hold circuits b, c, and e and other factors, the above circuit has the following problems.

It is difficult to solve a problem of noise superimposition on a signal only by analog signal processing.

Because of difficulty in applying the CMOS manufacturing technology, it is difficult to implement the above circuit as a single IC (integrated circuit) chip in such a manner that it is combined with other circuits (e.g., an image signal processing circuit)

In view of the above, correlated double sampling processing circuits that perform digital processing have been proposed, which are disclosed in Japanese Patent Laid-open No. 266156/1999 and No. 13691/2000, for example.

However, the conventional circuits have various kinds of problems. For example, they require a high power supply voltage when digitized and they cannot provide a wide signal dynamic range. They also have a problem that they cannot be miniaturized because they require a field memory etc.

SUMMARY OF THE INVENTION

An object of the present invention is therefore to realize a sampling processing device that is simple in configuration and suitable for digitization and IC-chip implementation, and to solve problems that accompany the digitization.

To solve the above problems, the invention provides a sampling processing device comprising a sample-and-hold circuit, an analog-to-digital conversion circuit disposed downstream of the sample-and-hold circuit, a latch circuit disposed downstream of the analog-to-digital conversion circuit, and a calculation section for performing addition or subtraction on an input signal to the latch circuit and a delayed output signal of the latch circuit.

Therefore, the invention makes it possible to form a sampling processing device that has a simple configuration and is suitable for digital processing by using latch circuits without using a number of sample-and-hold circuits. The invention also makes it possible to implement a sampling processing circuit as one chip in such a manner that it is combined with other circuits.

DETAILED DESCRIPTION OF THE PREFERRED EMBODIMENT

The present invention relates to a sampling processing device having a sample-and-hold circuit and an analog-to-digital conversion circuit disposed downstream of the sample-and-hold circuit. Further, one or a plurality of latch circuits are disposed downstream of the analog-to-digital conversion circuit, and a calculation section for performing addition or subtraction on an input signal to the latch circuit and a delayed output signal of the latch circuit is provided.

Figure 2:
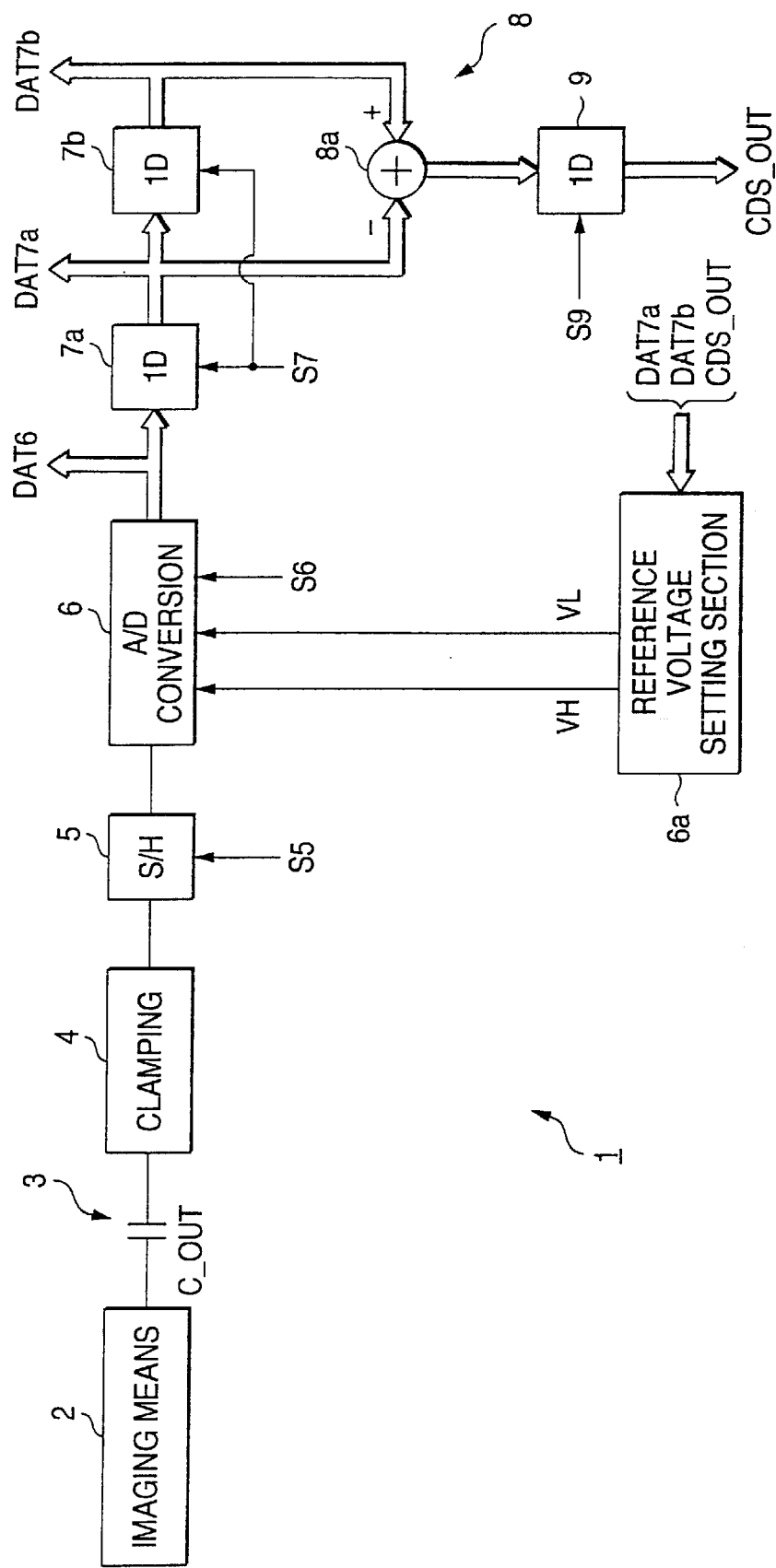
FIG. 2 is a block diagram showing the configuration of an exemplary sampling processing device according to the present invention.

FIG. 2 shows the configuration of an exemplary sampling processing device according to the invention as a correlated double sampling circuit that performs digital processing. The "correlated double sampling" is such that phase adjustment is made by performing a second sampling with a delay from a first sampling. Calculation is performed by using correlation among a plurality of sampling data, and it is used for noise elimination and suppression and other purposes.

In FIG. 2, it is assumed that the sampling processing device 1 is applied to an imaging apparatus. FIG. 2 shows the main part of a signal processing circuit that processes an output of an imaging means 2. Typical examples of the imaging means 2 are CCD (charge coupled device) solid-state imaging devices (e.g., an area image sensor and a line image sensor). The imaging means 2 is not limited to those and other examples are solid-state imaging devices of the MOS (metal-oxide-semiconductor) type, the CMOS type, etc. It goes without saying that it may be of a single-substrate type, a multi-substrate type, etc.

First, an output signal of the imaging means 2 is sent to a clamp circuit 4 via a DC component cutting means 3. In FIG. 2, the DC component cutting means 3, which is provided to cut the DC component of a signal, is a coupling capacitor which is a simplest example. However, the DC component cutting means 3 is not limited to it and may be a high-pass filter or the like.

The clamp circuit 4 is a circuit for adding a DC component to a signal that has passed through the DC component cutting means 3. That is, the clamp circuit 4 makes it possible to add a desired DC voltage component to a signal obtained by cutting the DC voltage component by the DC component cutting means 3. This processing makes it possible to decrease the DC voltage component of an output signal of the imaging means 2. Without this processing, if the DC voltage component is high, for example, as high as 5 V or more, it would exceed a voltage (3.3 V) used in an IC and hence would cause problems; for example, when the sampling processing device 1 is implemented as one chip in such a manner as to be combined with other circuits (e.g., an image signal processing circuit), the intended circuit is not suitable for microprocessing (the use of transistors having great gate lengths is needed undesirably).

The signal in which the DC component has been decreased by the clamp circuit 4 is supplied to a sample-and-hold circuit 5, which extracts signal levels (sampling) while receiving a timing control signal (i.e., a sample-and-hold pulse signal; denoted by "S5") from a signal generation circuit (not shown). The sample-and-hold circuit 5 may have any configuration as long as it is suitable for integration. However, to keep a sample-and-hold voltage constant, a circuit having a small leak current is desirable.

An output signal of the sample-and-hold circuit 5 is supplied to a downstream analog-to-digital conversion circuit 6 (abbreviated as "A/D" in FIG. 2), where it is subjected to quantization. From the viewpoint of high-speed processing, it is preferable that the analog-to-digital conversion circuit 6 have a fully parallel comparison type configuration that is composed of a series resistor network, a comparison section, and an encoder. An exemplary circuit configuration is such that a series resistor network that is connected to a high-potential-side power source and a low-potential-side power source, a differential chopper comparator, and an encoder are provided, and that a reference level (or a reset potential) and a signal level (signal potential) of an imaging output are captured alternately and digital data corresponding to the difference between the two levels is output. Among signals VH, VL, and S6 that are input to the circuit 6, the first two signals are supplied from a reference voltage setting section 6a. The signal VH is supplied to a high-potential-side reference voltage terminal and the signal VL is supplied to a low-potential-side reference voltage terminal. The signal S6 is an analog-to-digital conversion pulse signal (timing control signal) that is supplied from the signal generation circuit (not shown). Since, as described above, the DC component cutting means 3 and the clamp circuit 4 are provided and an input signal is subjected to sample-and-hold processing and analog-to-digital conversion after its DC component is cut and its DC level is clamped at a proper potential (e.g., about 1.5 V when the operation voltage of the analog-to-digital conversion circuit 6 is 3.3 V), no high power supply voltage is necessary and hence the sampling processing device 1 is suitable for power source sharing for the following reason. In general, a high power supply voltage is necessary in the case of processing a signal including a large DC component, because the power source for the high reference voltage of the analog-to-digital conversion should provide a potential that is higher than a maximum value that is the DC component (e.g., 9 V) of a signal plus a contribution of its AC component and the power source for the low reference voltage should provide a potential that is lower than a minimum value that is the DC component of a signal plus a contribution of the AC component. Further, a wider dynamic range can be obtained than in the conventional case. This is because a wider dynamic range can be obtained when analog-to-digital conversion is performed on a signal including a 3.3-V DC component obtained by voltage reduction after DC component cutting and clamping and an AC component of hundreds of millivolts than when analog-to-digital conversion is performed on a signal including a 9-V DC component and hundreds of millivolts.

As described later, the analog-to-digital conversion circuit 6 converts a reset voltage (a level in a feedthrough period) and a signal potential of an imaging output into digital data of a prescribed number of bits, which is sent to a first latch circuit 7a.

A delayed output of the first latch circuit 7a is sent to a downstream second latch circuit 7b. Symbol "1D" shown in FIG. 2 means a delay of one unit time.

The sampling processing device 1 so configured that data having prescribed delay times are obtained by the two latch circuits (delaying and holding means) 7a and 7b. A delayed output signal that has passed through the first latch circuit 7a and a delayed output signal that has passed through the second latch circuit 7b are sent to a calculation section 8. Each of the first and second latch circuits 7a and 7b is an n-bit register, a D flip-flop, or the like, and is supplied with a latch control signal (a latch pulse signal; denoted by "S7") from the signal generation circuit (not shown).

The calculation section 8 is a subtracter 8a that performs subtraction between outputs of the first and second latch circuits 7a and 7b. An output of the subtracter 8a becomes output data after passing through a third latch circuit 9. More specifically, as shown in FIG. 2, the outputs of the first latch circuit 7a and the second latch circuit 7b are supplied to the subtracter 8a as a negative-side input and a positive-side input, respectively. Therefore, receiving a control signal (a latch pulse signal; denoted by "S9") that is supplied from the signal generation circuit (not shown), the latch circuit 9 outputs, as correlated double sampling processing data, data obtained by subtracting the output data (denoted by "DAT7a") of the first latch circuit 7a from the output data (denoted by "DAT7b") of the second latch circuit 7b.

As described above, imaging data that has been subjected to analog-to-digital conversion phase-adjusted by the downstream latch circuits 7a and 7b, subjected to subtraction, and then latched, whereby only signal data (digital data indicating a video signal level) obtained by eliminating reset noise is extracted and transferred to an image signal processing circuit (not shown; a circuit that performs luminance signal processing, chroma signal processing, etc.) that is provided downstream of the sampling processing device 1.

Where the potential level of an input signal to the analog-to-digital conversion circuit 6 is too low, it is preferable to take a proper measure such as regulating the amplitude level by amplifying an output signal of the imaging means 2 by inserting an amplifier before the DC component cutting means 3.

Figure 3:
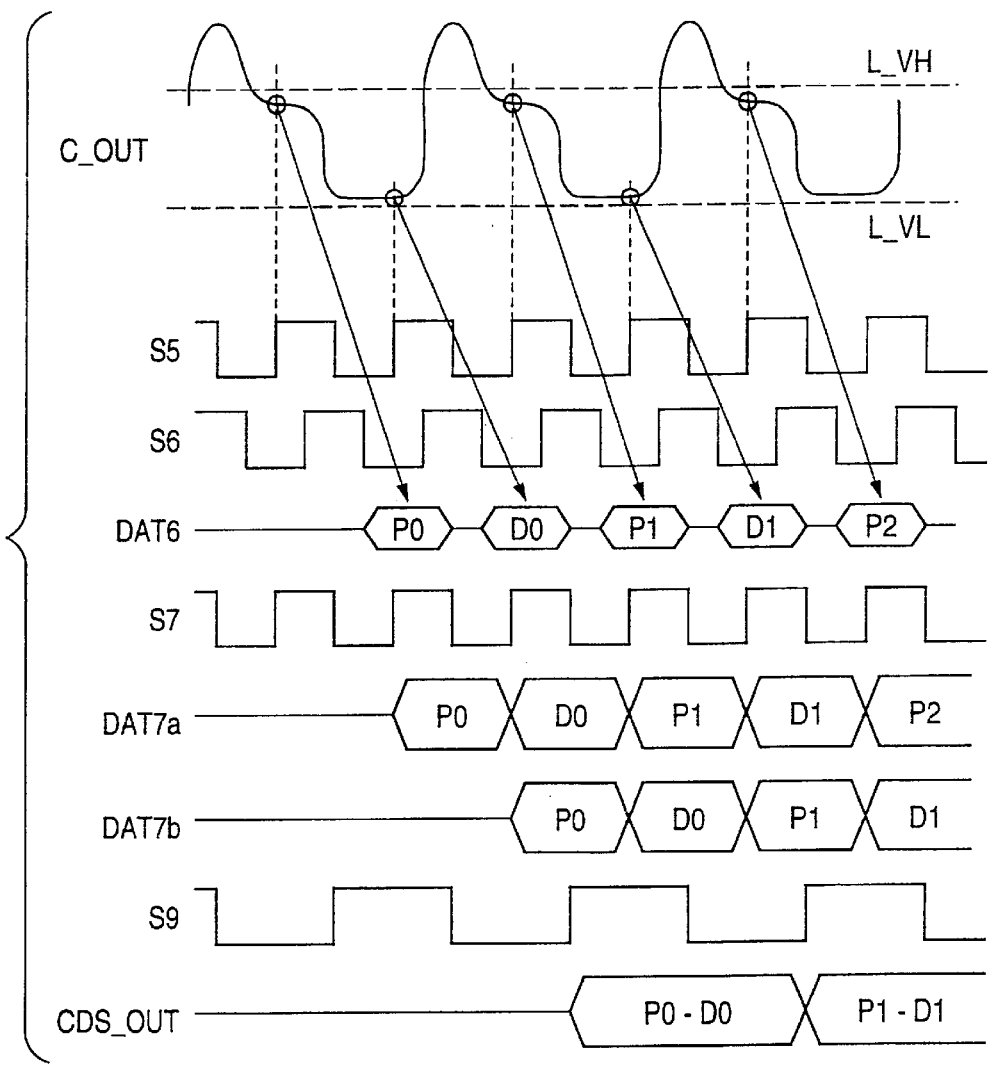
FIG. 3 is a time chart showing the operation of the sampling processing device of FIG. 2.

FIG. 3 is for description of waveforms at individual circuit sections and timing of control signals. Symbols shown in FIG. 3 have the following meanings.

C_OUT: An imaging output signal, that is, an output signal of the imaging means 2.
    L_VH: The potential level of the signal VH.
    L_VL: The potential level of the signal VL.
    DAT6: Output data of the analog-to-digital conversion circuit 6.

P0, P1, P2, . . . : Digital data corresponding to reset potentials (reference potentials).

D0, D1, D2, . . . : Digital data corresponding to signal potentials.

CDS_OUT: Output data obtained by the correlated double sampling.

Symbols S5, S6, S7, and S9 denote the signals as mentioned above. The signals other than the signal S6 are subjected to leading-edge triggering (the signal S6 is subjected to trailing-edge triggering).

As for the imaging output C_OUT, three periods that are a reset period, a zero-level (reference-level) period (or a feedthrough period), and a signal period are repeated periodically and the potential levels of the last two periods are subjects of the sampling processing.

That is, the sample-and-hold processing and the analog-to-digital conversion are performed on reset potentials and signal potentials of the imaging output C_OUT, whereby data Pi (i=0, 1, 2, . . . ) and data Di (i=0, 1, 2, . . . ) are output alternately.

The levels L_VH and L_VL are determined in accordance with the output signal level of the imaging means 2. The high-potential level L_VH is set equal to or higher than the maximum value of reset potentials in a field. The low-potential level L_VL is set equal to or lower than the minimum value of signal potentials in a field, and should be set higher than the ground potential. This is because if it were set at the ground potential, an extracted video signal would not be given a sufficient dynamic range. For example, assume a case that a signal obtained by the imaging means 2 is subjected to analog-to-digital conversion after being subjected to DC component cutting and clamping at 1.5 V. If it is also assumed that a signal component that is output from the imaging means 2 swings in a range of 1.0 to 2.0 V (it does not always swing in the full range of 0 to 3.3 V), about a half of the conversion data width is useless. To prevent occurrence of such an ineffective portion, it is preferable to widen the dynamic range by making the low-potential-side level L_VL as close to the minimum value of the signal component as possible.

Control is so made that the above reference voltage levels L_VH and L_VL are set so as to vary every predetermined number of fields instead of being always kept constant. That is, from the viewpoint of making the analog-to-digital conversion circuit 6 less prone to influence of a level variation in the signal C_OUT, it is preferable to update the setting values by automatically re-setting the reference voltages of the reference voltage setting section 6a every field or every several fields in accordance with the output signal voltage of the imaging means 2. For example, receiving the signal CDS_OUT, the reference voltage setting section 6a determines, from imaging data, the maximum value of reset voltages and the minimum value of signal voltages in a period of one field or several fields and updates the levels L_VH and L_VL continually.

Data DAT7a and data DAT7b that is delayed from the data DAT7a by one unit time (i.e., a delay time corresponding to one latch pulse) are sent to the subtracter 8a and then latched, whereby difference data P0–D0, P1–D1, etc. are obtained as output data CDS_OUT. That is, data Pi–Di where i (=0, 1, 2, . . . ) is an integer index means data obtained by subtracting data Di from data Pi (since noise components included in the respective data have a strong correlation, they cancel out each other when subjected to subtraction). Therefore, the data Pi–Di represents signal data in which the data Pi serves as a reference level (attention should be paid to the fact that it is a negative signal).

Figure 1:
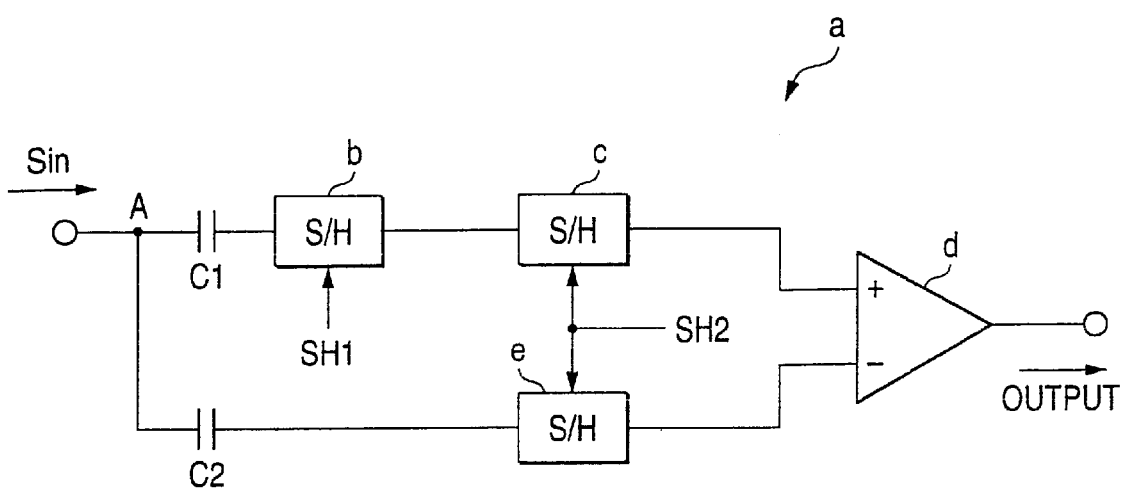
FIG. 1 is a block diagram showing a conventional sampling processing device.

As for the comparison between the sampling processing device 1 and the conventional device of FIG. 1, they are different from each other in that whereas in the latter device difference is taken between sampling data of a reset voltage and that of a signal voltage after they are extracted separately, in the former device time-series data in which sampling data of a reset voltage and that of a signal voltage appear alternately and data obtained by delaying the time-series data by a certain time are formed and difference is taken between those data.

Configured as described above, the sampling processing device 1 provides the following advantages:

Since a conventional analog circuit can be replaced by a circuit that has a relatively simple circuit configuration and is suitable for digital processing, a chip can be formed easily by the CMOS manufacturing technology. In particular, implementing the sampling processing circuit 1 as one chip in such a manner that it is combined with an image processing circuit is advantageous in terms of miniaturization and reduction of the circuit layout space and the occupation area.

As for the application to a correlated double sampling circuit, replacing conventional analog signal processing with digital signal processing can increase the noise resistance without causing serious problems (necessity of a high power supply voltage, an insufficient dynamic range, etc.).

The image quality can be increased by using the sampling processing device 1 for signal processing in a solid-state imaging apparatus.

Since the above description is directed to the case where the invention is applied to the correlated double sampling processing, the two latch circuits are provided upstream of the calculation section 8. In general, however, it goes without saying that the invention can broadly be applied to circuits in which a plurality of latch circuits (e.g., latches that are connected to each other in cascade) are provided downstream of the analog-to-digital conversion circuit 6 and delayed output data of the respective latch circuits are sent to the calculation section 8, whereby necessary digital data is calculated in accordance with the purpose of the sampling processing device.

As is apparent from the above description, the invention makes it possible to form a sampling processing device that has a simple configuration and is suitable for digital processing and IC-chip implementation without using an analog amplifier, a number of sample-and-hold circuits, or a storage device such as a field memory.

The invention makes it possible to digitize correlated double sampling with a relatively simple configuration that is composed of a sample-and-hold circuit, an analog-to-digital conversion circuit, two latch circuits, and a calculation section, without causing serious problems.

The invention makes it possible to miniaturize an imaging apparatus and increase its image quality.

Further, the invention can realize proper analog-to-digital conversion processing that is not influenced by a level variation of an imaging output.

What is claimed is:

1. A sampling processing device comprising:
   a source of a signal;
   a DC component cutting means to cut the DC component of said signal;
   a clamp circuit for adding a DC voltage component to said signal received from said cutting means;
   a sample-and-hold circuit for extracting signal levels from said signals received from the clamp circuit;

an analog-to-digital conversion circuit disposed downstream of the sample-and-hold circuit;

a latch circuit disposed downstream of the analog-to-digital conversion circuit; and a calculation section for performing addition or subtraction on an input signal to the latch circuit and a delayed output signal of the latch circuit.

2. The sampling processing device according to claim 1, wherein said latch circuit further comprises:

a first latch circuit disposed downstream of the analog-to-digital conversion circuit; and a second latch circuit disposed downstream of the first latch circuit; and wherein the calculation section further comprises:

a subtracter for performing subtraction between a delayed output signal of the first latch circuit and a delayed output signal of the second latch circuit.

3. An imaging apparatus comprising:

imaging means providing an output signal;

a sample-and-hold circuit to which the output signal of the imaging means is input;

an analog-to-digital conversion circuit disposed downstream of the sample-and-hold circuit;

a latch circuit disposed downstream of the analog-to-digital conversion circuit; and a calculation section for performing addition or subtraction on an input signal to the latch circuit and a delayed output signal of the latch circuit.

4. The imaging apparatus according to claim 3, wherein the latch circuit further comprises:

a first latch circuit disposed downstream of the analog-to-digital conversion circuit; and a second latch circuit disposed downstream of the first latch circuit; and wherein the calculation section further comprises:

a subtracter for performing subtraction between a delayed output signal of the first latch circuit and a delayed output signal of the second latch circuit.

5. The image apparatus as set forth in claim 4, wherein a latch control signal S7 is provided to said first latch circuit and said second latch circuit, whereupon delayed output data signals are provided from each of said first and said second latch circuit.

6. The image apparatus as set forth in claim 5 further including a third latch circuit receiving a control signal S9, said third latch circuit receiving an output from said subtracter to output correlated double sampling processing data obtained by subtracting the output data of the first latch circuit 7a from the output data of the second latch circuit 7b.

7. The imaging apparatus according to claim 3, wherein reference voltages supplied to the analog-to-digital conversion circuit are set automatically every prescribed number of fields and a low-potential-side voltage of the reference voltages is set higher than a ground potential.

8. The image apparatus as set forth in claim 7 wherein a conversion pulse signal S6 is provided to said analog-to-digital conversion circuit to produce a digital data signal representative of said imaging means output signal received from said sample and hold circuit, and further including a reference voltage setting section providing a high and a low side reference voltage signal to said analog-to-digital conversion circuit.

9. The imaging apparatus of claim 3, further comprising:

a DC component cutting means to cut the DC component of said output signal from said imaging means; and a clamp circuit for adding a DC voltage component to said signal from said cutting means, thereby decreasing the DC voltage component of said output signal from said imaging means so that said sampling processing circuit is suitable to be implemented as a chip.

* * * * *

UNITED STATES PATENT AND TRADEMARK OFFICE
CERTIFICATE OF CORRECTION

PATENT NO.   : 6,614,378 B2
DATED        : September 2, 2003
INVENTOR(S)  : Miyazaki Harutomi et al.

It is certified that error appears in the above-identified patent and that said Letters Patent is hereby corrected as shown below:

<u>Title page,</u>
Item [75], Inventors, please add the following:
-- Ueno, Hiroshi, Tokyo (JP);
Okuzaki, Tsuyoshi, Tokyo (JP);
Shuto, Yasuyo, Kanagawa (JP) --

Signed and Sealed this

Twenty-fifth Day of January, 2005

JON W. DUDAS
*Director of the United States Patent and Trademark Office*